US008756538B2

(12) United States Patent
Anderson et al.

(10) Patent No.: US 8,756,538 B2
(45) Date of Patent: Jun. 17, 2014

(54) PARSING DATA REPRESENTATIVE OF A HARDWARE DESIGN INTO COMMANDS OF A HARDWARE DESIGN ENVIRONMENT

(71) Applicant: International Business Machines Corporation, Armonk, NY (US)

(72) Inventors: Hans-Werner Anderson, Filderstadt (DE); Uwe Brandt, Boeblingen (DE); Markus Buehler, Weil im Schoenbuch (DE); Katherine Eve, Stuttgart (DE); Thomas Kalla, Boeblingen (DE); Jens Noack, Stuttgart (DE); Monika Strohmer, Sindelfingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/770,229

(22) Filed: Feb. 19, 2013

(65) Prior Publication Data

US 2013/0219150 A1   Aug. 22, 2013

(30) Foreign Application Priority Data

Feb. 20, 2012  (EP) ..................................... 12156177

(51) Int. Cl.
*G06F 17/50* (2006.01)
(52) U.S. Cl.
USPC ............ 716/101; 716/102; 716/105; 716/110
(58) Field of Classification Search
CPC .............. G06F 11/2205; G06F 17/272; G06F 17/30908
USPC .......................... 716/100, 101, 102, 105, 110
See application file for complete search history.

(56) References Cited

U.S. PATENT DOCUMENTS

| 6,360,356 | B1 * | 3/2002 | Eng .............................. 716/105 |
| 7,702,499 | B1 * | 4/2010 | Lavagno et al. ................ 703/27 |
| 8,489,815 | B2 * | 7/2013 | Iyigun et al. ................... 711/118 |

* cited by examiner

*Primary Examiner* — Sun Lin
(74) *Attorney, Agent, or Firm* — H. Daniel Schnurmann

(57) ABSTRACT

A method for implementing a hardware design that includes using a computer for receiving structured data that includes a representation of a basic hardware structure and a complex hardware structure that includes the basic hardware structure, parsing the structured data and generating, based on a result of the parsing, commands of a hardware design environment.

14 Claims, 6 Drawing Sheets

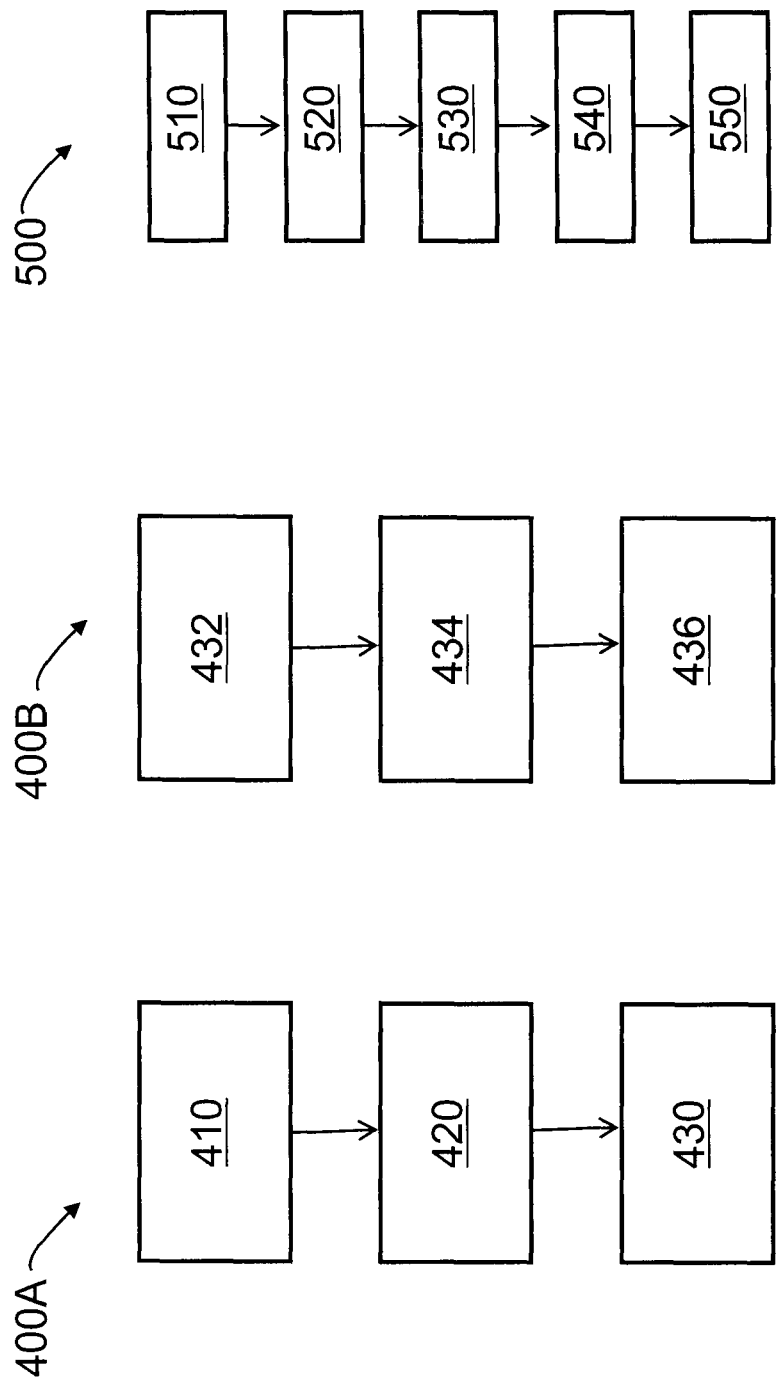

PARSING DATA REPRESENTATIVE OF A HARDWARE DESIGN INTO COMMANDS OF A HARDWARE DESIGN ENVIRONMENT

This application claims priority to Application No. 12156177.3 filed on Feb. 20, 2012, the entire contents of which are incorporated herein by reference.

FIELD OF THE INVENTION

The present invention relates to a method for processing hardware design data, and a system for processing hardware design data.

BACKGROUND

In the design of hardware, e.g. memory arrays and other hardware having repetitive structures, it is known to use a so-called "compiler" that receives parameter inputs from a user and convert these inputs into commands that can be fed into a hardware design environment such as Cadence® that then produces layout data or schematics for the envisaged design. The "compiler" is preferably custom code that takes into consideration not only the envisaged structure of the hardware design, but also, to some respect, specifics of the technology to be used for implementing the hardware design.

SUMMARY

In one aspect, an embodiment provides a method for hardware design (e.g. for the design of hardware that includes array-like structures) in which the hardware design is represented in a structured file (e.g. XML) that is parsed and processed (by a "compiler") into commands of a hardware design environment. The structured file can be obtained by converting spreadsheet data representative of the design into the structured file. By removing design issues from the compiler, it becomes possible to use the same compiler for a broad variety of tasks, which increases the benefits of compiler optimizations and relieves designers of the burden of compiler programming.

By allowing the hardware designs to be represented in the form of a spreadsheet, a hardware designer can easily manipulate the design data, even without knowledge of the compiler code. Moreover, simple spreadsheet formulas can be used to vary the size of array-like structures in accordance with customer requirements.

In one aspect, an embodiment provides a method for hardware design, e.g. to the design of an integrated electronic circuit. The integrated electronic circuit may comprise an array, e.g. a sub-circuit having a repetitive or regular pattern of circuit elements. For example, the array may comprise a plurality of circuit elements arranged in rows and columns. The circuit elements may share a common structure. For illustrative purposes, the circuit elements may be identical or exhibit mirror/rotational symmetry to one another. The array may be a memory circuit, e.g. an SRAM.

The method may comprise parsing structured data, e.g. data in XML format. In this respect, the method may comprise receiving the structured data, e.g. from a storage medium and/or via a computer network. The structured data may be structured by keywords, tags, tabs, formatting, etc.

The structured data may include a representation of (at least part of) a hardware design. For example, the structured data may include a representation of at least one basic hardware structure and at least one complex hardware structure. One or more or all of the complex hardware structures may include one or more of the basic hardware structures. In other words, any of the basic hardware structures may constitute "building blocks" of the complex hardware structures. Such basic hardware structures are sometimes termed "leaf cells." Similarly, any of the complex hardware structures may include one or more of the other complex hardware structures. In other words, any of the basic hardware structures may constitute a "building block" of another complex hardware structure. The structured data may represent variations of the basic/complex hardware structures by specifying an angle of rotation or an axis of inversion (e.g. mirror horizontally/vertically) of the respective basic/complex hardware structure. The structure data may include information specifying, for one or more or each of the basic/complex hardware structures represented by the structured data, any of a size, a location, an orientation, an alignment, a name, one or more power supply terminals, one or more input terminals, one or more output terminals and/or a logical function, etc. of the respective hardware structure. The structure data may include information specifying, for one or more or each of the basic/complex hardware structures represented by the structured data, a positional relationship of the respective hardware structure to one or more other of the basic/complex hardware structures. Similarly, the structure data may include information specifying, for one or more or each of the basic/complex hardware structures represented by the structured data, one or more electrical connections between the respective hardware structure and one or more other of the basic/complex hardware structures.

The structure of the structured data may be representative of a type of information contained in a respective structure of the structured data. For example, the structure of the structured data may be representative of whether the information contained in a respective structure of the structured data is representative of general, i.e., global information, information pertaining to a basic hardware structure or information pertaining to a complex hardware structure.

In the context of the present disclosure, the term "parsing" may be understood as including an analysis of data with an aim of identifying syntactic identifiers (e.g. keywords, tags, tabs, and the like) and/or (logical) data structures within the data. Such data structures may be delimited or otherwise identified/demarcated by the syntactic identifiers. In the case of XML data, for example, data structures typically known as "XML elements" can be delimited by so-called tags, i.e. by character strings having a known format. Similarly, the term "parsing" may be understood as comprising an extraction of the respective data represented by/stored within respective (logical) data structures within the parsed data. For example, the parsing may comprise extracting size data associated with a hardware element from a data structure representative of the hardware element and including data fields representative of the size of the hardware element. The extracted data may be stored, e.g. in a data memory and/or in (logical) data structures having a data format that differs from the format of the parsed data. In the context of a data structure, the adjective "logical" can be understood as signifying that the data representative of the respective data structure can be interpreted (e.g. based on external, i.e., given data descriptions) as having the respective structure even if the physical representation of the data, e.g. in memory, does not directly reflect the data structure. Accordingly, the term "parsing" may moreover be understood as comprising a transformation of data structures in one data format into data structure in another data format, e.g. from a tabular representation into an XML representation. Similarly, the term "parsing" may be understood as comprising a transformation of data structures in one data format into data of another format, e.g. from an XML representation into corresponding database commands, e.g. a commands of a Cadence® database system. For example, XML data representative (e.g. by way of a correspondingly identified data structure) of a hardware element may be parsed into data elements representative of the individual characteristics of the hardware element (e.g. type, size, location, pins, etc.). Based on these data elements, database commands can be generated that instruct a database system to create a database entry representative of a hardware element having the respective characteristics.

The method may comprise generating commands of a hardware design environment, e.g. using a compiler. The generating may be based on a result of the parsing (of the structured data).

The hardware design environment may comprise a plurality of tools. For example, the hardware design environment may comprise a view tool for displaying data in accordance with any of a plurality of views. The plurality of views may include a schematic view that displays data representative of a hardware design as a schematic-style circuit diagram, e.g. as a diagram depicting a plurality of circuit elements such as transistors, resistors, ICs, etc. and the electrical interconnection of the plurality of circuit elements. The plurality of views may include a layout view that displays data representative of a hardware design in a form representative of the physical layout of the hardware design. The layout view may depict the shapes and positions of the individual geometrical structures (e.g. squares, rectangles, circles, and the like) on the various manufacturing process layers (silicon layers, metal layers), which structures constitute the electrical devices (transistors, wires, etc.) of the hardware design. The layout view may depict masks used in manufacture of the hardware design. The plurality of views may include a symbol view that displays data representative of a hardware design as a plurality of interconnected symbols, e.g. as a plurality of integrated circuits, each having a respective plurality of IO pins. Similarly, the hardware design environment may comprise a design rule tool that verifies the conformity of the hardware design with a plurality of hardware design rules. As such, the design rule tool may perform DRC, LVS, timing tests, etc. For example, the design rule tool may verify that a specified minimum distance is maintained between all elements of the hardware design at a specified manufacturing process layer. Similarly, the design rule tool may verify that all elements of the hardware design at a specified manufacturing process layer have a specified minimum dimension. The design rule tool may verify that a (specified) layout of the hardware design corresponds to a (specified) schematic/circuit diagram of the hardware design. The design rule tool may verify that the signal paths between respective circuit elements of a specified layout are short enough to allow all signals to propagate and stabilize when operated at a specified frequency. The design rules may be process dependent. The hardware design environment may comprise a graphic user interface (GUI) that allows a user to view and/or manipulate data of a hardware design. The hardware design environment may comprise a programmable user interface that a user to manipulate data of a hardware design, e.g. using a programming language of the hardware design environment. The hardware design environment may comprise storage for storing data representative of a specified process technology or of a specified project. For example, the data may specify the number of available metal layers, the structure of various circuit elements (e.g. transistors, memory cells, etc.), a minimum structure size, etc.

The hardware design environment may be a Cadence® system. Accordingly, the commands may be SKILL commands. The hardware design environment may likewise be any other command-based database system. For example, the hardware design environment may comprise a database for storing hardware design data (e.g. schematic information, symbol information and/or layout information) with regard to one or more hardware technologies (e.g. a particular 32 nm process and a particular 22 nm process). The hardware design environment may moreover comprise an interface that, in response to (programming language) commands and/or a user input, manipulates the data in the database and/or generates an output on the basis of data in the database. Accordingly, the generated commands may include commands that effect the manipulation of the hardware design data (within the hardware design environment), e.g. when executed in the hardware design environment, i.e. when the commands are processed in/by the hardware design environment. Such (programming language) commands may be in C++. The method may comprise subjecting the manipulated hardware design data to designs tests (e.g. DRC, LVS, METH, timing tests, etc.). This can be done within/by the hardware design environment or in an external system.

One or more of the complex hardware structures may be a hardware array that includes a regular pattern of one or more of the basic/complex hardware structures. Inter alia, one or more of the complex hardware structures may be an array of array cell structures (arranged in rows and columns), each of the array cell structures being identical to a common one of the basic/complex hardware structures or to a rotational/mirror image variant of that one basic/complex hardware structure. In other words, the array may consist of identical hardware structures notwithstanding rotational or symmetrical variations. The structured data may represent such an array by specifying the number of rows and columns as well as the basic/complex hardware structure(s) constituting the individual array cell structures.

The aforementioned generating of commands of a hardware design environment may include (e.g. as a first part of a sequence) a generating of global commands. Such global commands may include at least one global command of the hardware design environment and/or at least one command that, when executed in the hardware design environment, initiates/defines a global variable of the hardware design environment. "Global" commands/variables may be understood as commands/variables that are available in any context (within a given project) within the hardware design environment.

The generating of commands of a hardware design environment may include (e.g. as a second part of a sequence) generating at least one command that, when executed in the hardware design environment, defines one or more of the basic hardware structures in the hardware design environment. The defining of a basic hardware structure in the hardware design environment may include defining any of a size, a location, an orientation, an alignment, a name, one or more power supply terminals, one or more input terminals, one or more output terminals and/or a logical function, etc. of the basic hardware structure in the hardware design environment, e.g. storing and/or modifying any such data in a database of the hardware design environment.

The generating of commands of the hardware design environment may include (e.g. as a third part of a sequence) generating at least one command that, when executed and the hardware design environment, defines one or more of the complex hardware structures in the hardware design environment. The defining of a complex hardware structure in the hardware design environment may include defining any of a size, a location, an orientation, an alignment, a name, one or more power supply terminals, one or more input terminals, one or more output terminals and/or a logical function, etc. of the complex hardware structure in the hardware design environment, e.g. storing and/or modifying any such data in a database of the hardware design environment. The defining of a complex hardware structure may moreover comprise establishing any of the aforementioned data based on corresponding data of one or more of the basic hardware structures included in the complex hardware structure and/or on one or more of the aforementioned global variables. The generating of commands that define a complex hardware structure may include calculating the position of each of the basic hardware structures in an array of basic hardware structures, e.g. based on information specifying the number of rows and columns in the array.

As touched upon above, the generating of commands may be carried out in a particular sequence in which (all) global commands/variables are generated first, (all) basic hardware structures are defined second and (all) complex hardware structures are defined third.

The method may comprise converting structure description data into the aforementioned structured data. In this respect, the may comprise receiving such structure description data, e.g. from a storage medium, via a computer network and/or by user input. The structure description data may include tabular data, e.g. data in which individual data entries can be depicted in rows and columns of information. The structure description data may include a representation of one or more or all of the aforementioned basic/complex hardware structures. In particular, the tabular data may include a representation of one or more or all of the aforementioned basic/complex hardware structures. The tabular data may be spreadsheet data, e.g. data in which individual data entries are separated by tabs. The manner of conversion is specific to the format of the structure description data and the structure of the structured data and is thus not detailed herein. It may nonetheless be said that the conversion may be effected in a manner that retains the information contained in the structure description data in part or in full in the structured data. Moreover, the structure description data may include identifiers that provide an indication of how the structure description data can be converted into the structured data, e.g. providing indications of the structure of the structured data. Accordingly, the conversion may comprise a parsing of the structure description data.

Providing for conversion of structure description data into the aforementioned structured data allows the structure description data to be provided in any of a wide variety of formats that may be more legible to a human than the format of the structured data prescribed by a compiler that parses the structured data and generates commands of a hardware design environment based on the parsing results.

The method may include receiving spreadsheet data that includes at least one equation that interrelates the value of at least two cells of the spreadsheet data. Such equations can be useful for varying the structure description data, e.g. the size of array-like structures, in accordance with customer requirements. For example, a user could input, into a cell of the spreadsheet, a value indicative of the number of input bits that an array structure is to be designed to receive and other cells indicative e.g. of the number of input terminals, the size of the array structure, the size of a corresponding driving circuit and the size of a corresponding address decoder could be automatically adjusted accordingly. As such, the method may comprise modifying, in response to a (user) input, the spreadsheet data based on the equation, e.g. using a spreadsheet application. The method may moreover comprise outputting the modified spreadsheet data as the aforementioned structure description data.

Summarizing the above in loose terms, the method may comprise receiving spreadsheet data, modifying the spreadsheet data using a spreadsheet application, outputting the modified spreadsheet data as structure description data that is received and converted into structured data (e.g. into XML data by a custom-programmed spreadsheet to XML converter), receiving and parsing the structured data (e.g. at a compiler) and generating, based on a result of the parsing, commands (e.g. SKILL commands) of a hardware design environment (e.g. Cadence®) that define e.g. a layout and/or schematic of a hardware structure in the hardware design environment.

While the teachings of the present disclosure have been discussed hereinabove mainly in the form of a method, the teachings may be embodied, *mutatis mutandis*, in the form of a system, e.g. a hardware design system, or a computer program product, as will be appreciated by the person skilled in the art.

The system may be configured and adapted to effect any of the actions described above with respect to the disclosed method.

The system may comprise a data receiving component that receives structured data as discussed hereinabove.

The system may comprise a data parsing component that parses structured data as discussed hereinabove.

The system may comprise a command generating component that generates commands (of a hardware design environment) as discussed hereinabove.

The system may comprise a structure description data receiving component that receives structure description data as discussed hereinabove.

The system may comprise a data converting component that converts structure description data into structured data as discussed hereinabove.

The system may comprise a spreadsheet data receiving component that receives spreadsheet data as discussed hereinabove.

The system may comprise a spreadsheet data modifying component that modifies spreadsheet data as discussed hereinabove.

The system may comprise an output component that outputs modifies spreadsheet data as discussed hereinabove.

Any of the aforementioned components of the system communicate with any other of the aforementioned components of the system. In this respect, the system may comprise one or more communication busses/links interconnecting the respective components.

BRIEF DESCRIPTION OF THE SEVERAL VIEWS OF THE DRAWINGS

FIG. 4A schematically shows a flow diagram of an embodiment of a data processing method in accordance with the present disclosure;

FIG. 4B schematically shows a flow diagram of an embodiment of the generating step shown in FIG. 4A;

FIG. 5 schematically shows a flow diagram of an embodiment of a data processing method in accordance with the present disclosure.

DETAILED DESCRIPTION

Figure 1:
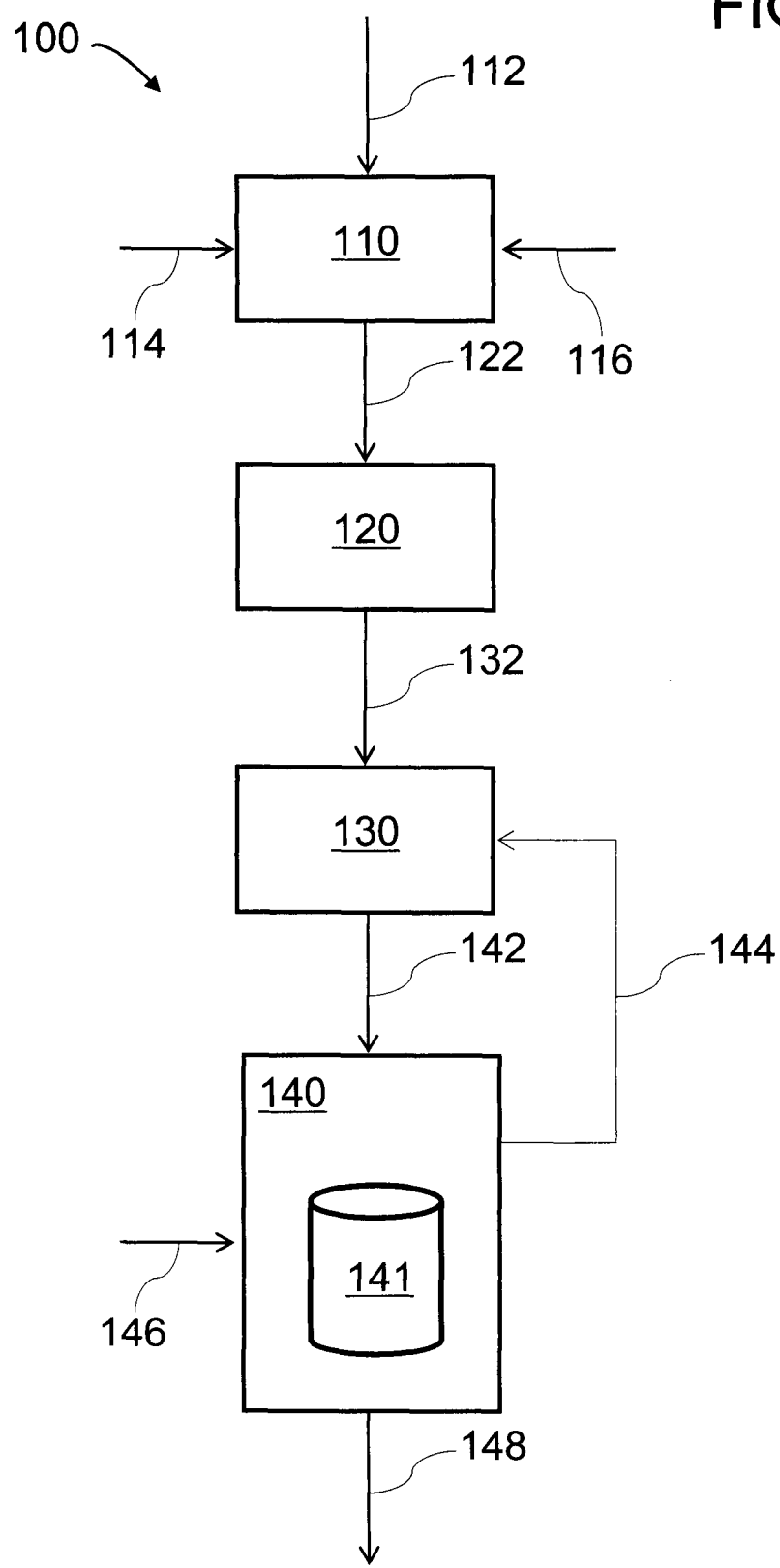
FIG. 1 schematically shows an exemplary flow of data in a hardware design system in accordance with the present disclosure.

FIG. 1 shows an exemplary flow of data in a hardware design system 100 in accordance with an embodiment of the present disclosure.

In the illustrated embodiment, hardware design system 100 comprises a spreadsheet application 110, a spreadsheet to XML converter 120, a compiler 130 and a hardware design environment 140 that includes a database 141.

In the illustrated embodiment, spreadsheet application 110 may receive any of a variety of inputs, including spreadsheet data 112, a hardware designer input 114 and customer input 116. For example, spreadsheet application 110 may receive spreadsheet data 112 that has been prepared in advance. Spreadsheet data 112 may then be modified in accordance with hardware designer input 114 and/or customer input 116. For example, the spreadsheet data 112 could describe a plurality of hardware designs, and customer input 116 could specify which of the plurality of hardware designs is to be embodied. Naturally, customer input 116 need not be directly input by a customer, but may instead be input in accordance with a customer's instructions. Similarly, spreadsheet data 122 may be created within spreadsheet application 110 based solely on hardware designer input 114.

Spreadsheet to XML converter 120 receives spreadsheet data 122 that is representative of a hardware design from spreadsheet application 110 and converts spreadsheet data 122 into corresponding XML-formatted data 132.

Compiler 130 receives XML-formatted data 132 from spreadsheet to XML converter 120, parses XML-formatted data 132 and generates, based on a result of the parsing, commands 142 of the hardware design environment 140.

Hardware design environment 140 receives commands 142 from compiler 130 and processes hardware design data in database 141 in accordance with commands 142. Such hardware design data may include layout data, schematic data, symbol data and/or abstract data, for example. In other words, the hardware design data may include data that depicts (at least part of) the hardware design e.g. in a layout, schematic, symbol and/or abstract view. Hardware design environment 140 then outputs at least part 148 of the processed hardware design data, e.g. for subsequent processing leading up to manufacture of the hardware design. Hardware design environment 140 may receive a user input 146, e.g. for establishing initial hardware design data in database 141. Such initial hardware design data may include data that depicts one or more components of the hardware design e.g. in a layout, schematic, symbol and/or abstract view. Such components may include, for example, inverters, buffers, amplifiers, OR circuits, AND circuits, bit storage cells, etc. Hardware design environment 140 may moreover provide feedback 144 to compiler 130, e.g. re successful completion of commands 142.

Figure 2:
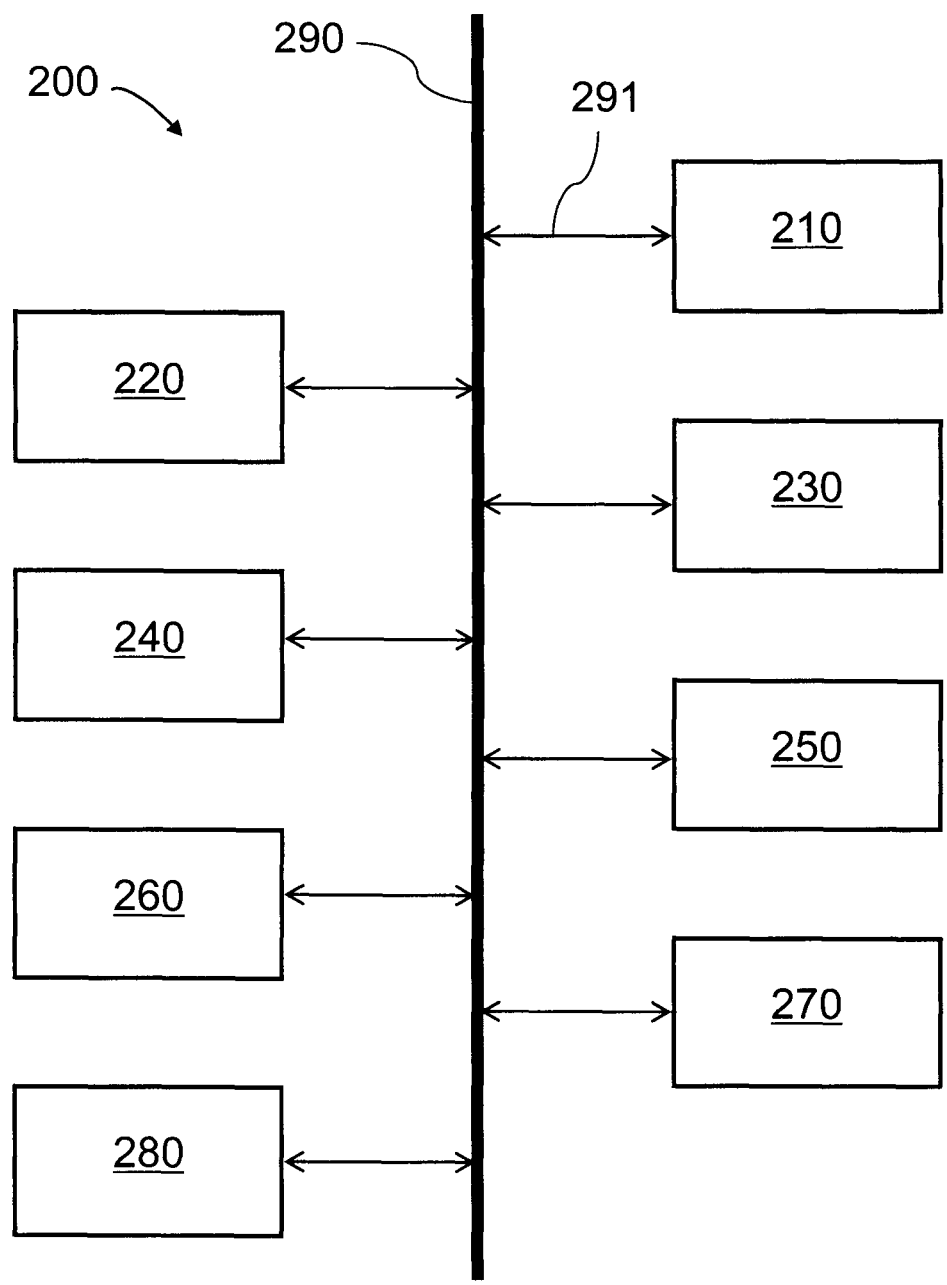
FIG. 2 schematically shows an embodiment of a hardware design system in accordance with the present disclosure.

FIG. 2 schematically shows an embodiment of a hardware design system 200 in accordance with the present disclosure, e.g. as described above.

In the illustrated embodiment, system 200 comprises a data receiving component 210, a data parsing component 220, a command generating component 230, a structure description data receiving component 240, a data converting component 250, a spreadsheet data receiving component 260, a spreadsheet data modifying component 270, an output component 280 and a communication bus 290 comprising a plurality of communication links 291 (for the sake of legibility, only one of the communication links bears a reference sign). Communication bus 290 and the communication links 291 communicatively interconnect the aforementioned components 210-280.

Figure 3A:
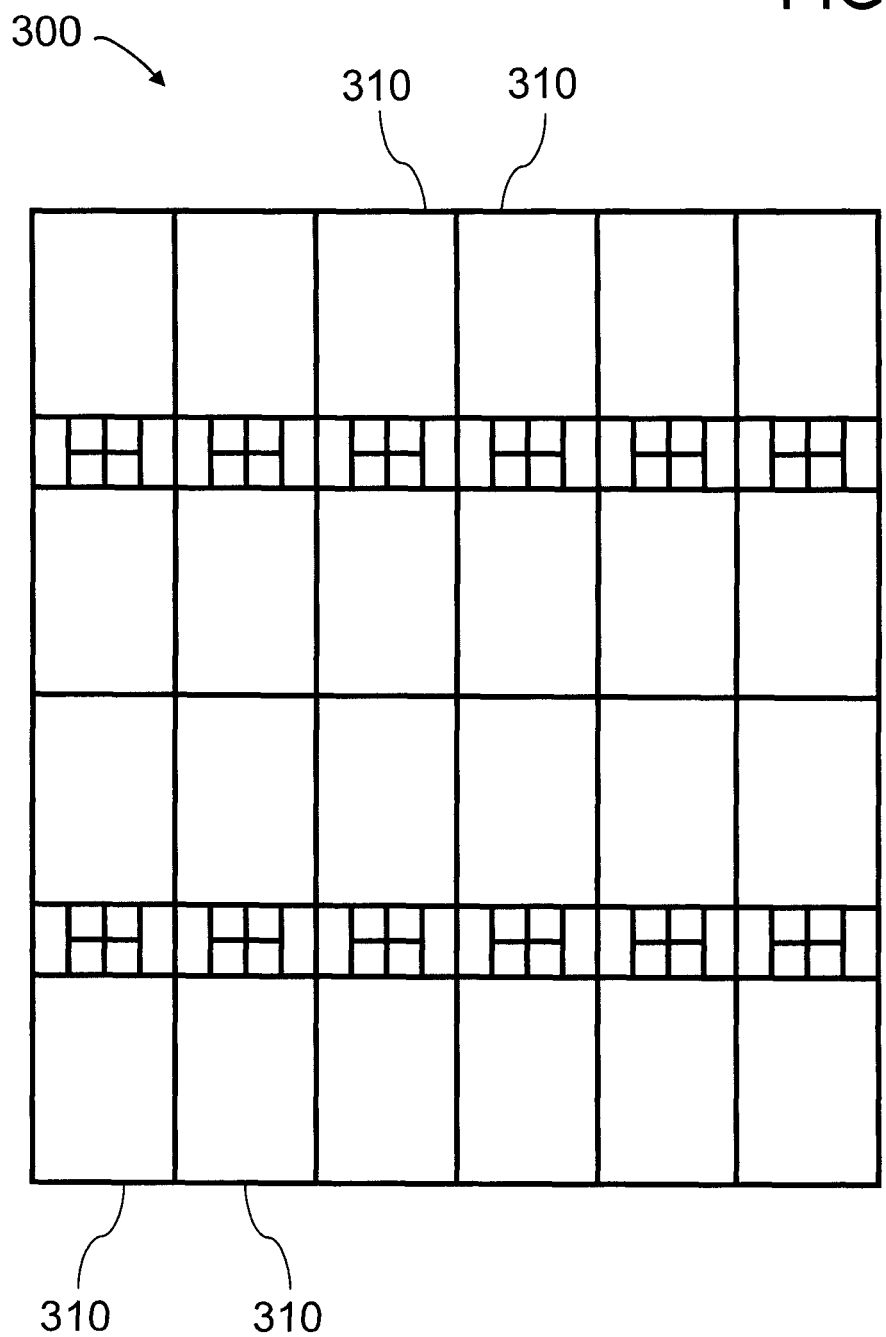
FIG. 3A schematically shows an exemplary embodiment a simple hardware design in accordance with the present disclosure.
Figure 3B:
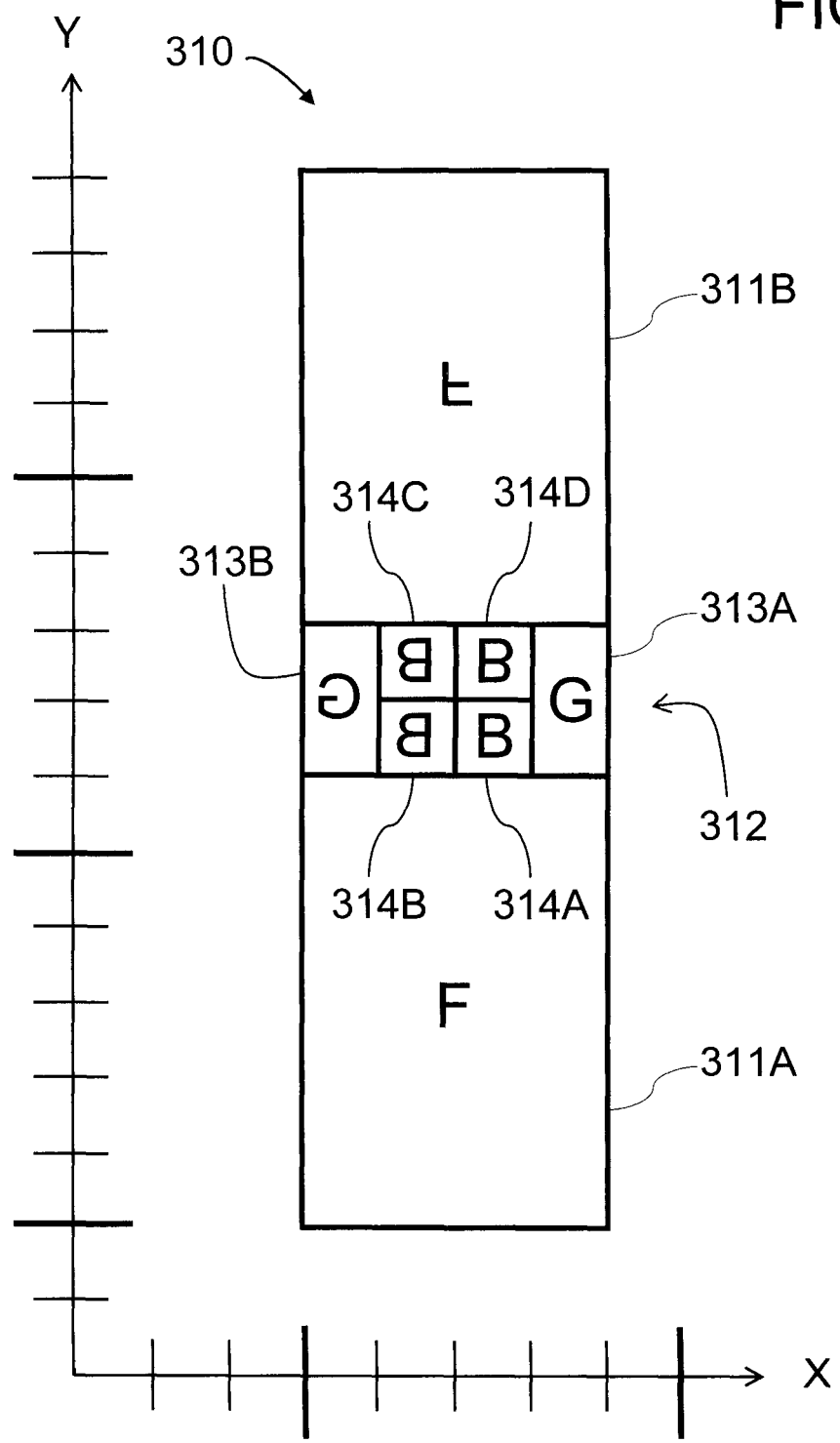
FIG. 3B schematically shows details of the hardware design of FIG. 3A.

FIG. 3A schematically shows an exemplary embodiment a simple hardware design 300 in accordance with the present disclosure. FIG. 3B schematically shows details of hardware design 300 of FIG. 3A.

In the exemplary embodiment illustrated in FIG. 3A, hardware design 300 is a 6 MB memory structure comprising an array of twelve 512 kB memory units 310 designed for a 32 nm fabrication process. As shown in FIG. 3B, each of memory units 310 comprises a first memory circuit 311A, a second memory circuit 311B and an interface circuit 312. Interface circuit 312 comprises a first input/output circuit 313A, a second input/output circuit 313B, a first addressing circuit 314A, a second addressing circuit 314B, a third addressing circuit 314C and a fourth addressing circuit 314D. As indicated by the designators on each of the aforementioned circuits, second memory circuit 311B is a mirror image of first memory circuit 311A relative to the X-axis, second input/output circuit 313B is a mirror image of first input/output circuit 313A relative to the Y-axis, second addressing circuit 314B is a mirror image of first addressing circuit 314A relative to the Y-axis, third addressing circuit 314C is identical to first addressing circuit 314A, albeit rotated by 180°, and fourth addressing circuit 314D is a mirror image of first addressing circuit 314A relative to the X-axis.

Each of the aforementioned circuits of memory unit 310 is rectangular. First memory circuit 311A and second memory circuit 311B are of size 4 units times 6 units. First input/output circuit 313A and second input/output circuit 313B are of size 1 unit times 2 units. Each of the four addressing circuits is of size 1 unit times 1 unit. Interface circuit 312 is of size 4 units times 2 units. In the exemplary embodiment, 1 unit equals 100 μm.

Hardware design 300 may be represented as a scalable design in tabular/spreadsheet form as follows.

| X | MACROSTRUCTURE: | |
|---|---|---|
| X | GLOBALS: | |
| - | N | {{1,2,3,4,5,6,7,8}} |
| - | M | {{1,2,3,4,5,6,7,8}} |
| - | capacity | {N x M x 512kB} |
| - | scale | 100 μm |
| - | height | {N x 14 x scale} |
| - | width | {M x 4 x scale} |
| - | area | {width * height} |

-continued

| | | | | |
|---|---|---|---|---|
| X | fab_process | 32 nm | | |
| X | vhdl_path | my_computer/design_data/32_nm_designs/vhdl | | |
| X | END | | | |
| X | LEAFCELLS: | | | |
| X | libname | power_rails | | |
| X | cell# | width | height | power rails |
| X | * | | | |
| X | memory_circuit | {4 * scale} | {6 * scale} | vd, gd |
| X | IO_circuit | {1 * scale} | {2 * scale} | vd, gd, vc |
| X | addressing_circuit | | {1 * scale} | {1 * scale} vd, gd |
| X | * | | | |
| X | END | | | |
| X | STRUCTURES: | | | |
| X | STRUCT: | | | |
| X | struct_name | interface_circuit | | |
| X | cell# | pos_X | pos_Y | orientation * |
| X | IO_circuit | 0 | 0 MY | |
| X | addressing_circuit | | {1 * scale} | 0 MY |
| X | addressing_circuit | | {2 * scale} | 0 R0 |
| X | addressing_circuit R180 | | {1 * scale} | {1 * scale} |
| X | addressing_circuit MX | | {2 * scale} | {1 * scale} |
| X | IO_circuit | {3 * scale} | 0 R0 | |
| X | * | | | |
| X | END | | | |
| X | STRUCT: | | | |
| X | struct_name | 512_kB_32_nm | | |
| X | struct_height | {14 * scale} | | |
| X | struct_width | {4 * scale} | | |
| X | cell# | pos_X | pos_Y | orientation * |
| X | memory_circuit0 | | 0 R0 | |
| X | interface_circuit | | 0 {6* scale} | R0 |
| X | memory_circuit0 | | {8 * scale} | MX |
| X | * | | | |
| X | END | | | |
| X | STRUCT: | | | |
| X | struct_name | memory_structure | | |
| X | struct_height | {N x 14 x scale} | | |
| X | struct_width | {M x 4 x scale} | | |
| X | cell# | rows | cols | orientation * |
| X | 512_kB_32_nmN | | M R0 | |
| X | * | | | |
| X | END | | | |
| X | END | | | |
| X | END | | | |

The aforementioned receiving of structure description data including tabular data (as also recited in the claims) may comprise receiving such a tabular/spreadsheet representation. Similarly, the aforementioned receiving of spreadsheet data (as also recited in the claims) may comprise receiving such a tabular/spreadsheet representation.

In the above tabular/spreadsheet representation, the first column of data designates whether the respective row of information is to be subject to conversion to another data format ("X") or is simply of internal use within the tabular/spreadsheet representation ("-"). The symbols ":" and "END" mark the beginning and the end of a section corresponding, in XML, to an XML element comprising XML child elements. The symbols "#" and "*" (latter occurring twice) demarcate tabular information, e.g. to be converted into attributed tags in XML. Rows containing two elements represent an XML element and its value. Furthermore, single curly brackets are representative of a formula, and double curly brackets are representative of a list of choices that may be made available to a user via a drop-down menu. Calculation of formulas and presentation of the drop-down menu may be carried out by a spreadsheet application. In the illustrated embodiment, N=2 and M=6. However, N and M may be set so as to achieve the desired capacity within design constraints such as area, width and height. Such values may be calculated and displayed in the spreadsheet upon choice of values for N and M.

For example, the value represented by a formula may be calculated by opening the tabular/spreadsheet representation in a spreadsheet application that then performs calculation of the formulas and stores an instance of the tabular/spreadsheet representation in which the formulas are replaced by the calculated values. As touched upon above, the spreadsheet application may also allow a user to select from respective lists of values, which selected values may likewise be stored with the calculated values in the instance of the tabular/spreadsheet representation. In the above example, for instance, the formula "{4*scale}" for the width of the element "memory_circuit" would be replaced by the value 400 μm. Similarly, using N=2 and M=6 as the user-values as shown in FIG. 3A, the formula "{width*height}" for the global element "area" would be replaced by the value 6.72 mm$^2$. The aforementioned modifying (in response to a user input) of spreadsheet data by means of a spreadsheet application based on an equation (as also recited in the claims) may comprise such a replacing of a formula by a value. Such a storing of an instance of the tabular/spreadsheet representation in which the formulas are replaced by the calculated values may constitute the aforementioned outputting of modified spreadsheet data as structure description data (as also recited in the claims).

The above tabular/spreadsheet representation of hardware design 300 may be converted to a XML representation by the following steps. Such a conversion may constitute the aforementioned converting of structure description data into structured data (as also recited in the claims).

The rows of information marked (by an "X") for conversion are parsed on the basis of keywords and other demarcating elements that are indicative of data structures represented by the tabular/spreadsheet data. In other words, a search may be performed for symbols and keywords defined in the "grammar" of the tabular/spreadsheet representation as demarcating data structures (e.g. as described above) and then, using the "grammar" of the tabular/spreadsheet representation, the data may be converted from tabular/spreadsheet representation into another (e.g. XML) representation. The conversion may comprise storing the data in an intermediate representation. For example, in the aforementioned exemplary grammar, the nested use of the symbol ":" and the keyword "END" indicates an XML element named MACROSTRUCTURE that contains the XML child elements GLOBALS, LEAFCELLS and STRUCTURES. The XML element named STRUCTURES contains three XML child elements named STRUCT. Similarly, rows comprising two elements (i.e. a row demarcated by a preceding carriage return and a trailing carriage return comprising two elements separated by a tab) represent an XML element and its value/content. For example, the XML element "GLOBALS" comprises a child XML named "fab_process" having a value of "32 nm." Similarly, symbols "#" and "*" (latter occurring twice) demarcate tabular information to be converted into attributed tags in XML. As such, the third XML element "STRUCT" (i.e. the XML element "STRUCT" comprising a child element "struct_name" having the value "memory_structure") comprises an instance of an XML attributed tag named "cell", the instance bearing the designation "512_kB-32_nm." The instance comprises the attribute "row" having the value "2" (=N), the attribute "cols" having the value "6" (=M) and the attribute "orientation" having the value "R0."

In XML, XML elements are demarcated by a preceding tag having the format "<element_name>" and by a trailing tag having the format "<\element_name>." Attributed tags have the format "<element_name attribute_1="value_of_attribute_1" attribute_2="value_of_attribute_2" . . . >instance_name<\element_name>." As such, knowledge of the represented data structures obtained by parsing the tabular/spreadsheet representation provides a basis for generating an XML representation of the data structures.

In the above example, for instance, the parser could begin by examining the character strings of each row marked (by an "X") for conversion. In the first row, the parser would find the string "MACROSTRUCTURE" followed by the demarking symbol ":" that symbolizes the beginning of an (XML) element. Using this information, the data converting component could output the XML expression "<macrostructure>" designating the beginning of an XML element named "macrostructure." In the second row, the parser would find the string "GLOBALS" followed by the demarking symbol ":" that symbolizes the beginning of another (XML) element. Using this information, the data converting component could output the XML expression "<globals>" designating the beginning of an XML element named "globals." In the third row marked for conversion, the parser would find two strings separated by a tab, namely the string fab_process and the string 32 nm. Using this information, the data converting component could output the XML expression "<fab_process>32 nm<\fab_process>" designating the beginning of an XML element bearing the name "fab_process," the value/content of the XML element (namely "32 nm") and an end of the XML element bearing the name "fab_process." Similarly, the fourth row could be converted to the XML expression "<vhdl_path>my_computer/design_data/32_nm_designs/vhdl<\vhdl_path>." In the fifth row, the parser would find the keyword "END" designating the end of the most recent (XML) element, in this case the (XML) element named "globals." Using this information, the data converting component could output the XML expression "<\globals>" designating the end of the XML element named "globals." In the first row, the parser would find the string "LEAFCELLS" followed by the demarking symbol ":" that symbolizes the beginning of an (XML) element. Using this information, the data converting component could output the XML expression "<leafcells>" designating the beginning of an XML element named "leafcells." This process would continue in an analogous manner until all rows have been parsed and converted.

Interpreting the "grammar" of the tabular/spreadsheet representation as discussed above, the above tabular/spreadsheet representation of hardware design 300 may be converted to the following XML representation.

```
<macrostructure>
<globals>
< fab_process >           32 nm           < \fab_process >
<vhdl_path>
my_computer/design_data/32_nm_designs/vhdl
<\vhdl_path>
<\globals>
<leafcells>
<libname>             power_rails            <\libname>
<cell width = "400 µm" height = "600 µm" power rails = "vd, gd">
memory_circuit
<\cell>
<cell width = "100 µm" height = "200 µm" power rails = "vd, gd, vc">
IO_circuit
<\cell>
<cell width = "100 µm" height = "100 µm" power rails = "vd, gd">
addressing_circuit
<\cell>
<\leafcells>
<structures>
<struct>
<struct_name> interface_circuit <\struct_name>
<cell pos_X = "0" pos_Y = "0" orientation = "MY">
IO_circuit
<\cell>
<cell pos_X = "100 µm" pos_Y = "0" orientation = "MY">
addressing_circuit
<\cell>
<cell pos_X = "200 µm" pos_Y = "0" orientation = "R0">
addressing_circuit
<\cell>
<cell pos_X = "100 µm" pos_Y = "100 µm" orientation = "R180">
addressing_circuit
<\cell>
<cell pos_X = "200 µm" pos_Y = "100 µm" orientation = "MX">
addressing_circuit
<\cell>
<cell pos_X = "300 µm" pos_Y = "0" orientation = "R0">
IO_circuit
<\cell>
<\struct>
<struct>
<struct_name> 512_kB_32_nm <\struct_name>
<struct_height> 1400 µm <\struct_height>
<struct_width> 400 µm <\struct_width>
<cell pos_X = "0" pos_Y = "0" orientation = "R0">
memory_circuit
<\cell>
<cell pos_X = "0" pos_Y = "600 µm" orientation = "R0">
interface_circuit
<\cell>
<cell pos_X = "0" pos_Y = "800 µm" orientation = "MX">
memory_circuit
<\cell>
```

-continued

```
<\struct>
<struct>
<struct_name> memory_structure <\struct_name>
<cell rows = "2" cols = "6" orientation = "R0">
512_kB_32_nm
<\cell>
<\struct>
<\structures>
<\macrostructure>
```

The XML representation above can be parsed and hardware design environment commands can be generated based on the results of the parsing, accordingly. As above, the parsing may comprise searching the XML representation for keywords and other demarcating elements that are indicative of data structures represented by the XML data.

In the first line of the above example, for instance, the parser would find the string "<macrostructure>" that, by virtue of the symbols "<" and ">," symbolizes the beginning of an XML element. The name of the element, namely "macrostructure," could symbolize to the command generating component that the set of elements contained in that XML element relate to a single macrostructure. In the second line, the parser would find the string "<globals>" that symbolizes the beginning of an XML element named "globals." The name "globals" could symbolize to the command generating component that the set of elements contained in that XML element relate to global variables of the hardware design environment.

In the third line, the parser would find the string "<fab_process>32 nm<\fab_process>" that symbolizes an XML element named "fab_process" and having the value/content "32 nm." Knowing from the second line that this element relates to a global variable of the hardware design environment, the command generating component could output a command that sets the global variable identified by the name of the XML element, namely "fab_process," to the value "32 nm," e.g. a command "SET(FAB_PROCESS, 32 nm)." The aforementioned generating of a global command that initiates a global variable of the hardware design environment (as also recited in the claims) may comprise such a generating of a command as described here. The command generating component could convert the fourth to sixth lines of the XML representation into commands of the hardware design environment in an analogous manner. In the seventh line, the parser would find the string "<\globals>" that, by virtue of the symbols "<\" and ">," symbolizes the end of the XML element named "globals," thus symbolizing to the command generating component that subsequent expressions no longer relate to global variables of the hardware design environment.

In line eight, the parser would find the string "<leafcells>" that, by virtue of the symbols "<" and ">," symbolizes the beginning of an XML element. The name of the element, namely "leafcells," could symbolize to the command generating component that the set of elements contained in that XML element relate to leafcells, i.e. to basic hardware structures. In line nine, the parser would find the string "<libname>power_rails<\libname>" that symbolizes an XML element named "libname" and having the value/content "power_rails." The name "libname" could symbolize to the command generating component that the content of the XML element designates a library required for defining the leafcells. Accordingly, the command generating component could output a command that loads the respective library, e.g. a command "LOAD_LIBRARY(power_rails)" instructing the hardware design environment to load the designated library. In the tenth to twelfth lines, the parser would find the string "<cell width="400 μm"height="600 μm" power rails="vd, gd">memory_circuit<\cell>" that, as discussed above, symbolizes an attributed tag. The aforementioned parsing of structured data (as also recited in the claims) may comprise such a parsing as described here. Specifically, this syntax could symbolize to the command generating component that an instance (to be named "memory_circuit") of a "cell" element, i.e. of a leafcell element, is to be generated, the instance having the specified attributes, namely width=400 μm, height=600 μm and power rails=vd, gd. As such, the command generating component could output a command instructing the hardware design environment to generate a new instance of a leafcell named "memory_circuit", e.g. a command "NEW_LEAFCELL(memory_circuit)." The command generating component could furthermore output a command instructing the hardware design environment to set the size attribute, i.e. the width and height attributes, of the "memory_circuit" to the specified values, e.g. to output a command "SET_SIZE(memory_circuit, 400, 600)." The command generating component could furthermore output a command instructing the hardware design environment to set the power rails of the "memory_circuit" to the specified values, e.g. to output the commands "ADD_PIN(memory_circuit, vd)" and "ADD_PIN(memory_circuit, gd)." The aforementioned generating (based on a result of said parsing) of commands of a hardware design environment (as also recited in the claims) may comprise such a generating of commands as described here. In particular, the aforementioned generating of commands of the hardware design environment that define a basic hardware structure in the hardware design environment (as also recited in the claims) may comprise such a generating of commands as described here. Such commands effect a manipulation of data stored by the hardware design environment (e.g. data providing schematic, symbolic and/or layout representations of hardware designs) such that data representative of a leafcell having the defined attributes is stored. The command generating component could convert the thirteenth to eighteenth lines of the XML representation into commands of the hardware design environment in an analogous manner. In the nineteenth line, the parser would find the string "<\leafcells>" that, by virtue of the symbols "<\" and ">," symbolizes the end of the XML element named "leafcells," thus symbolizing to the command generating component that subsequent expressions no longer relate to leafcells, i.e. to basic hardware structures.

In line twenty, the parser would find the string "<structures>" that, by virtue of the symbols "<" and ">," symbolizes the beginning of an XML element. The name of the element, namely "structures," could symbolize to the command generating component that the set of elements contained in that XML element relate to complex hardware structures. In line twenty-one, the parser would find the string "<struct>" that, by virtue of the symbols "<" and ">," symbolizes the beginning of an XML element. The name of the element, namely "struct," could symbolize to the command generating component that the set of elements contained in that XML element relate to a new complex hardware structure. In line twenty-two, the parser would find the string "<struct_name>interface_circuit<\struct_name>" that symbolizes an XML element named "struct_name" and having the value/content "interface_circuit." The name "struct_name" could symbolize to the command generating component that the content of the XML element designates the name of the current/new complex hardware structure. Accordingly, in response to the parsing results of lines twenty-one and twenty-two, the command generating component could output a command instructing the hardware design environment to create a complex hardware structure named "interface_circuit," e.g. the command "NEW_STRUCTURE(interface_circuit)."

In the twenty-third to twenty-fifth lines, the parser would find the string "<cell pos_X="0" pos_Y="0"orientation="MY">IO_circuit</cell>" that, as discussed above, symbolizes an attributed tag. Specifically, this syntax could symbolize to the command generating component that an instance of a "cell" element, namely of an "IO_circuit" leafcell element, is to be generated as a constituent element of the complex hardware structure, the instance having the specified attributes, namely pos_X=0, pos_Y=0 and orientation=MY. As such, the command generating component could output a command instructing the hardware design environment to add a new instance of an "IO_circuit" leafcell element to the current complex hardware structure, namely to the "interface_circuit," e.g. a command "Current_leafcell=ADD_LEAFCELL(interface_circuit, IO_circuit)." The command generating component could furthermore output a command instructing the hardware design environment to set the orientation attribute of the current leafcell (i.e. of the current instance of the "IO_circuit") to the specified value, e.g. to output a command "REFLECT(Current_leafcell, vertical)." The command generating component could furthermore output a command instructing the hardware design environment to set the position attributes, i.e. the X and Y positions, of the current leafcell to the specified values, e.g. to output a command (Current_leafcell, 0, 0)." Such commands effect a manipulation of data stored by the hardware design environment (e.g. data providing a schematic, symbolic and/or layout representation of a hardware design) such that the data representative of the "interface circuit" structure comprises data indicating that the "interface circuit" structure comprises an "IO circuit" leafcell of the specified orientation at the specified location. The aforementioned generating of commands of the hardware design environment that define a complex hardware structure in the hardware design environment (as also recited in the claims) may comprise such a generating of commands as described here.

The command generating component could convert the remaining lines of the XML representation into commands of the hardware design environment in an analogous manner. The final line of the XML representation could symbolize to the command generating component that definition of the macrostructure is complete.

Interpreting the above XML representation from beginning to end as touched upon above, commands can be generated as reflected by the following pseudo commands.

```
SET(FAB_PROCESS, 32 nm)
SET(VHDL_PATH, my_computer/design_data/32_nm_designs/vhdl)
LOAD_LIBRARY(power_rails)
NEW_LEAFCELL(memory_circuit)
SET_SIZE(memory_circuit, 400, 600)
ADD_PIN(memory_circuit, vd)
ADD_PIN(memory_circuit, gd)
NEW_LEAFCELL(IO_circuit)
SET_SIZE(IO_circuit, 100, 200)
ADD_PIN(IO_circuit, vd)
ADD_PIN(IO_circuit, gd)
ADD_PIN(IO_circuit, vc)
NEW_LEAFCELL(addressing_circuit)
SET_SIZE(addressing_circuit, 100, 100)
ADD_PIN(addressing_circuit, vd)
ADD_PIN(addressing_circuit, gd)
NEW_STRUCTURE(interface_circuit)
Current_leafcell = ADD_LEAFCELL(interface_circuit, IO_circuit)
REFLECT(Current_leafcell, vertical)
```

-continued

```
SET_COORDINATES(Current_leafcell, 0, 0)
Current_leafcell = ADD_LEAFCELL(interface_circuit, addressing_circuit)
REFLECT(Current_leafcell, vertical)
SET_COORDINATES(Current_leafcell, 100, 0)
Current_leafcell = ADD_LEAFCELL(interface_circuit, addressing_circuit)
SET_COORDINATES(Current_leafcell, 200, 0)
Current_leafcell = ADD_LEAFCELL(interface_circuit, addressing_circuit)
ROTATE(Current_leafcell, 180)
SET_COORDINATES(Current_leafcell, 100, 100)
Current_leafcell = ADD_LEAFCELL(interface_circuit, addressing_circuit)
REFLECT(Current_leafcell, horizontal)
SET_COORDINATES(Current_leafcell, 200, 100)
Current_leafcell = ADD_LEAFCELL(interface_circuit, IO_circuit)
SET_COORDINATES(Current_leafcell, 300, 0)
NEW_STRUCTURE(512_kB_32_nm)
SET_SIZE(512_kB_32_nm, 400, 1400)
Current_leafcell = ADD_LEAFCELL(512_kB_32_nm, memory_circuit))
SET_COORDINATES(Current_leafcell, 0, 0)
Current_structure = ADD_STRUCTURE(512_kB_32_nmg, interface_circuit)
SET_COORDINATES(Current_structure, 0, 600)
Current_leafcell = ADD_LEAFCELL(interface_circuit, memory_circuit))
SET_COORDINATES(Current_leafcell, 0, 800)
NEW_STRUCTURE(memory_structure)
FOR row = 1 TO 2
FOR col = 1 TO 6
Current_structure = ADD_STRUCTURE(memory_structure, 512_kB_32_nm)
SET_COORDINATES(Current_structure, (row-1) * GET_WIDTH(512_kB_32_nm),
(col-1) * GET_HEIGHT(512_kB_32_nm))
NEXT col
NEXT row
```

FIG. 4A schematically shows a flow diagram 400A of an embodiment of a data processing method in accordance with the present disclosure, e.g. as described above.

In the illustrated embodiment, flow diagram 400A comprises a step 410 of receiving structured data that includes a representation of a basic hardware structure and a complex hardware structure that includes the basic hardware structure, a step 420 of parsing the structured data and a step 430 of generating, based on a result of the parsing, commands of a hardware design environment.

FIG. 4B schematically shows a flow diagram 400B of an embodiment of generating step 430 shown in FIG. 4A.

In the illustrated embodiment, generating step 430, i.e. flow diagram 400B, comprises a step 432 of generating at least one of a global command of the hardware design environment and a command that, when executed in the hardware design environment, initiates a global variable of the hardware design environment, a step 344 of generating commands of the hardware design environment that, when executed in the hardware design environment, define the basic hardware structure in the hardware design environment and a step 346 of generating commands of the hardware design environment that, when executed in the hardware design environment, define the complex hardware structure in the hardware design environment.

FIG. 5 schematically shows a flow diagram 500 of an embodiment of a data processing method in accordance with the present disclosure, e.g. as described above.

In the illustrated embodiment, flow diagram 500 comprises a step 510 of receiving structure description data including tabular data, the tabular data including a representation of a basic hardware structure and a complex hardware structure that includes the basic hardware structure, a step 520 of converting the structure description data into structured data that includes a representation of the basic hardware structure and the complex hardware structure, a step 530 of receiving the structured data, a step 540 of parsing the structured data and a step 550 of generating, based on a result of the parsing, commands of a hardware design environment.

Figure 6:
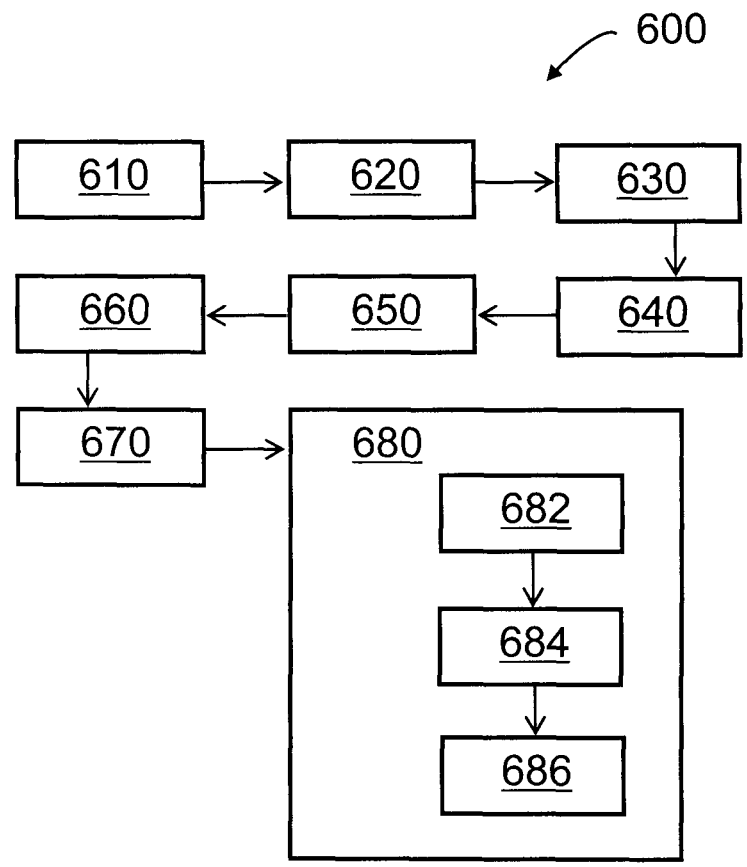
FIG. 6 schematically shows a flow diagram of an embodiment of a data processing method in accordance with the present disclosure.

FIG. 6 schematically shows a flow diagram 600 of an embodiment of a data processing method in accordance with the present disclosure, e.g. as described above.

In the illustrated embodiment, flow diagram 600 comprises a step 610 of receiving spreadsheet data including an equation that interrelates the value of at least two cells of the spreadsheet data, a step 620 of modifying, in response to a user input, the spreadsheet data by means of a spreadsheet application based on the equation, a step 630 of outputting the modified spreadsheet data as structure description data including tabular data, the tabular data including a representation of a basic hardware structure and a complex hardware structure that includes the basic hardware structure, a step 640 of receiving the structure description data, a step 650 of converting the structure description data into structured data that includes a representation of the basic hardware structure and the complex hardware structure, a step 660 of receiving the structured data, a step 670 of parsing the structured data and a step 680 of generating, based on a result of the parsing, commands of a hardware design environment, wherein step 680 comprises, as optional steps, a step 682 of generating at least one of a global command of the hardware design environment and a command that, when executed in the hardware design environment, initiates a global variable of the hardware design environment, a step 684 of generating commands of the hardware design environment that, when executed in the hardware design environment, define the basic hardware structure in the hardware design environment and a step 686 of generating commands of the hardware design environment that, when executed in the hardware design environment, define the complex hardware structure in the hardware design environment.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described with reference to flowchart illustrations and/or block diagrams of methods, apparatus (systems) and computer program products according to embodiments of the present disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The block diagrams in the Figures illustrate the architecture, functionality, and operation of possible implementations of systems, methods and computer program products according to various embodiments of the present disclosure. In this regard, each block in the block diagrams may represent a module, segment, or portion of code, which comprises one or more executable instructions for implementing the specified logical function(s). It should also be noted that, in some alternative implementations, the functions discussed hereinabove may occur out of the disclosed order. For example, two functions taught in succession may, in fact, be executed substantially concurrently, or the functions may sometimes be executed in the reverse order, depending upon the functionality involved. It will also be noted that each block of the block diagrams, and combinations of blocks in the block diagrams, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for processing a hardware design comprising:
using a computer, receiving structured data that includes a representation of a basic hardware structure and a complex hardware structure that includes said basic hardware structure;
parsing said structured data; and
generating, based on a result of said parsing, commands of a hardware design environment.

2. The method of claim 1, wherein said complex hardware structure is a hardware array that includes a regular pattern of said basic hardware structure.

3. The method of claim 1, wherein said commands include commands that, when executed in said hardware design environment, effect a manipulation of at least one of schematic data, symbol data, abstract data and layout data.

4. The method of claim 1, wherein said generating comprises
generating at least one of a global command of said hardware design environment and a command that, when executed in said hardware design environment, initiates a global variable of said hardware design environment;
generating commands of said hardware design environment that, when executed in said hardware design environment, define said basic hardware structure in said hardware design environment; and
generating commands of said hardware design environment that, when executed in said hardware design environment, define said complex hardware structure in said hardware design environment.

5. The method of claim 1 further comprising:
receiving structure description data including tabular data, said tabular data including a representation of said basic hardware structure and said complex hardware structure; and
converting said structure description data into said structured data.

6. The method of claim 5 further comprising:
receiving spreadsheet data including an equation interrelating a value of at least two cells of said spreadsheet data;
modifying, in response to a user input, said spreadsheet data by means of a spreadsheet application based on said equation; and
outputting said modified spreadsheet data as said structure description data.

7. The method of claim 1, wherein said structured data is XML data.

8. A hardware design system comprising:
a data receiving component that receives structured data that includes a representation of a basic hardware structure and a complex hardware structure that includes said basic hardware structure;
a data parsing component that parses said structured data; and
a command generating component that generates, based on a result of said data parsing component that parses said structure data commands of a hardware design environment.

9. The system of claim 8, wherein said complex hardware structure is a hardware array that includes a regular pattern of said basic hardware structure.

10. The system of claim 8, wherein said commands include commands that, when executed in said hardware design environment, effect a manipulation of at least one of schematic data, symbol data, abstract data and layout data.

11. The system of claim 8, wherein said command generating component performs the following:
generating at least one of a global command of said hardware design environment and a command that, when executed in said hardware design environment, initiates a global variable of said hardware design environment;
generating commands of said hardware design environment that, when executed in said hardware design environment, define said basic hardware structure in said hardware design environment; and
generating commands of said hardware design environment that, when executed in said hardware design environment, define said complex hardware structure in said hardware design environment.

12. The system of claim 11, further comprising:
- a structure description data receiving component that receives structure description data including tabular data, said tabular data including a representation of said basic hardware structure and said complex hardware structure; and
- a data converting component that converts said structure description data into said structured data.

13. The system of claim 12, further comprising:
- a spreadsheet data receiving component that receives spreadsheet data including an equation that interrelates a value of at least two cells of said spreadsheet data; and
- a spreadsheet data modifying component that modifies, in response to a user input, said spreadsheet data by means of a spreadsheet application based on said equation; and
- an output component that outputs said modified spreadsheet data as said structure description data.

14. The system of claim 8, wherein said structured data is XML data.

\* \* \* \* \*